United States Patent
Swoboda et al.

(10) Patent No.: US 10,676,386 B2
(45) Date of Patent: Jun. 9, 2020

(54) METHOD FOR GUIDING A CRACK IN THE PERIPHERAL REGION OF A DONOR SUBSTRATE

(71) Applicant: Siltectra GmbH, Dresden (DE)

(72) Inventors: Marko Swoboda, Dresden (DE); Christian Beyer, Dresden (DE); Franz Schilling, Dresden (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 0 days.

(21) Appl. No.: 16/360,182

(22) Filed: Mar. 21, 2019

(65) Prior Publication Data

US 2019/0218131 A1    Jul. 18, 2019

Related U.S. Application Data (63) Continuation of application No. 15/739,964, filed as application No. PCT/EP2016/064535 on Jun. 23, 2016, now Pat. No. 10,280,107.

(30) Foreign Application Priority Data

Jun. 23, 2015 (DE) ........................ 10 2015 008 037

(51) Int. Cl.
*H01L 21/268* (2006.01)
*B28D 1/22* (2006.01)
(Continued)

(52) U.S. Cl.
CPC ...... *C03B 33/0222* (2013.01); *B23K 26/0006* (2013.01); *B23K 26/359* (2015.10);
(Continued)

(58) Field of Classification Search
CPC ............. H01L 21/02005; H01L 21/268; H01L 21/304; C03B 33/0222; B23K 26/0624
See application file for complete search history.

(56) References Cited

U.S. PATENT DOCUMENTS 8,562,849 B2    10/2013  Bankaitis et al.
2005/0048738 A1*   3/2005  Shaheen ................ B23K 26/18
                                                    438/458
(Continued)

FOREIGN PATENT DOCUMENTS

DE       102013113030       10/2014
DE       10 2014 014486      4/2015
(Continued)

OTHER PUBLICATIONS

International Preliminary Report on Patentability of the corresponding PCT application PCT/EP2016/064535.

*Primary Examiner* — Tucker J Wright
*Assistant Examiner* — Wilner Jean Baptiste
(74) *Attorney, Agent, or Firm* — Murphy, Bilak & Homiller, PLLC (57) ABSTRACT

The present invention relates to a method for separating solid-body slices (1) from a donor substrate (2). The method comprises the steps of: producing modifications (10) within the donor substrate (2) by means of laser beams (12), wherein a detachment region is predefined by the modifications (10), along which detachment region the solid-body layer (1) is separated from the donor substrate (2), and removing material from the donor substrate (2), starting from a surface (4) extending in the peripheral direction of the donor substrate (2), in the direction of the centre (Z) of the donor substrate (2), in particular in order to produce a peripheral indentation (6).

17 Claims, 6 Drawing Sheets

(51) Int. Cl.

| | | |
|---|---|---|
| *C03B 33/02* | (2006.01) | |
| *B23K 26/00* | (2014.01) | |
| *B28D 5/00* | (2006.01) | |
| *C03B 33/09* | (2006.01) | |
| *H01L 21/304* | (2006.01) | |
| *B23K 26/359* | (2014.01) | |
| *B23K 26/70* | (2014.01) | |
| *B23K 26/60* | (2014.01) | |
| *H01L 21/02* | (2006.01) | |
| *B23K 101/40* | (2006.01) | |

(52) U.S. Cl.
CPC ............ *B23K 26/60* (2015.10); *B23K 26/702* (2015.10); *B28D 1/221* (2013.01); *B28D 5/0005* (2013.01); *C03B 33/091* (2013.01); *H01L 21/02005* (2013.01); *H01L 21/268* (2013.01); *H01L 21/304* (2013.01); *B23K 2101/40* (2018.08)

(56) References Cited

U.S. PATENT DOCUMENTS

| | | | |
|---|---|---|---|
| 2007/0125757 A1* | 6/2007 | Fukuyo | B23K 26/0604 219/121.72 |
| 2008/0012140 A1 | 1/2008 | Tsukano | |
| 2010/0012632 A1* | 1/2010 | Sakamoto | B23K 26/12 219/121.72 |
| 2014/0038392 A1 | 2/2014 | Yonehara et al. | |
| 2014/0199519 A1* | 7/2014 | Schillinger | B23K 26/0648 428/155 |
| 2015/0159289 A1 | 6/2015 | Munoz | |
| 2017/0301549 A1 | 10/2017 | Suzuki | |

FOREIGN PATENT DOCUMENTS

| | | |
|---|---|---|
| JP | H09 19857 | 1/1997 |
| JP | 2006 142556 | 6/2006 |
| JP | 2006 245498 | 9/2006 |
| JP | 2013 049161 | 3/2013 |
| WO | 2010072675 | 7/2010 |

\* cited by examiner

METHOD FOR GUIDING A CRACK IN THE PERIPHERAL REGION OF A DONOR SUBSTRATE

The present invention, according to claim 1, relates to a method for separating solid-body slices from a donor substrate.

In many technical fields (for example microelectronics or photovoltaic technology), materials such as silicon, germanium or sapphire are often used in the form of thin slices and plates (what are known as wafers). As standard, wafers of this kind are currently produced by sawing from an ingot, with relatively large material losses ("kerf loss") being sustained. Since the used starting material is often very costly, it is highly sought to produce wafers of this kind with less material consumption, and therefore more efficiently and more economically.

By way of example, with the currently conventional methods, almost 50% of the used material is lost as "kerf loss" in the production of silicon wafers for solar cells alone. Considered globally, this corresponds to an annual loss of more than 2 billion euros. Since the costs of the wafer account for the largest share of the cost of the finished solar cell (over 40%), the costs of solar cells could be significantly reduced by corresponding improvements in the wafer production.

Methods which dispense with the conventional sawing and for example can directly split off thin wafers from a thicker workpiece by use of temperature-induced stresses appear to be particularly attractive for wafer production of this kind without kerf loss ("kerf-free wafering"). These include in particular methods as described for example in PCT/US2008/012140 and PCT/EP2009/067539, where a polymer layer applied to the workpiece is used in order to produce these stresses.

With use of the methods according to the prior art, the produced wafers usually have greater thickness variations, wherein the spatial thickness distribution often presents a pattern having tetramerous symmetry. The total thickness variation (TTV) as considered over the entire wafer, with use of the previous methods, is often more than 100% of the average wafer thickness (a wafer for example of 100 micrometres average thickness, which for example at its thinnest point is 50 micrometres thick and at its thickest point is 170 micrometres thick, has a TTV of 170−50=120 micrometres, which corresponds to a total thickness variation of 120% relative to its average thickness). Wafers with high thickness variations of this kind are not suitable for many applications. In addition, in the most frequently occurring tetramerous thickness distribution patterns, the regions with the greatest fluctuations are disposed unfortunately in the middle of the wafer, where they are the most disruptive.

Here, crack formation is particularly critical, since solid-body slices with a low TTV can be directly produced only with very precise crack formation.

It has been found that modifications for specifying the course of the crack at a distance from the edge of the solid body can indeed be produced in a solid body by means of LASER beams, however this is not readily possible in the region of the edge of a solid body on account of edge effects. If the middle of the LASER focus directly contacts the edge of the material, one half of the beam thus contacts the solid body with finite extent, and the other half runs into the air. On account of the difference in refractive index, this causes damage at the side of the solid body, way beyond the actually intended damage layer after refractive index correction. Since, in addition, only half or a fraction of the LASER radiation is coupled into the material, the damage at the edge is reduced compared to in the middle of the solid body. This reduced damage causes the crack to be distorted over its course at the edge or means that the crack does not progress in the laser plane.

The object of the present invention is therefore to provide a method that enables the production of wafers having a low TTV.

The aforementioned object is achieved by a method according to claim 1. The method according to the invention for separating at least one solid-body layer, in particular a solid-body slice, from a donor substrate preferably comprises at least the following steps: providing a donor substrate, producing modifications within the donor substrate by means of LASER beams, wherein a detachment region is predefined by the modifications, along which detachment region the solid-body layer is separated from the donor substrate, removing material from the donor substrate, starting from a surface extending in the peripheral direction of the donor substrate, in the direction of the centre of the donor substrate, in particular in order to produce a peripheral indentation, wherein the detachment region is exposed by the material removal, separating the solid-body layer from the donor substrate, wherein the donor substrate is weakened in the detachment region by the modifications in such a way that the solid-body layer detaches from the donor substrate, or such a number of modifications are produced that the donor substrate is weakened in the detachment region in such a way that the solid-body layer detaches from the donor substrate or a stress-inducing layer is produced in or arranged on a surface of the donor substrate, in particular a planar surface, oriented at an incline relative to the peripheral surface, and mechanical stresses are produced in the donor substrate by a thermal treatment of the stress-inducing layer, wherein the mechanical stresses produce a crack for separating a solid-body layer, which crack propagates along the modifications, starting from the surface of the donor substrate exposed by the material removal.

This solution is advantageous since an edge of the donor substrate, in the region of which modifications for further forming of the detachment region can be produced only in a very complex manner, can be removed or reduced or modified. A radial material removal is thus hereby provided, as a result of which the distance of the peripheral surface from the detachment region is reduced.

Further preferred embodiments are the subject of the dependent claims and/or the following parts of the description.

The detachment region predefined by the modifications, in accordance with a further preferred embodiment of the present invention, is distanced further from the peripheral surface of the donor substrate before the material removal than after the material removal. This embodiment is advantageous since the detachment region thus can be easily produced and yet is still preferably adjacent to the outer peripheral surface of the donor substrate after the material removal.

The modifications for predefining the detachment region, in accordance with a further preferred embodiment of the present invention, are produced before the material removal, and, by means of the material removal, a reduction of the distance of the detachment region to less than 10 mm, in particular to less than 5 mm and preferably to less than 1 mm, is achieved at least at specific points, or the modifications for predefining the detachment region are produced after the material removal, wherein the modifications are produced in such a way that the detachment region is distanced, at least at specific points, by less than 10 mm, in particular less than 5 mm, and preferably less than 1 mm, from a surface exposed by the material removal. At least individual modifications of the detachment region are particularly preferably part of the surface of the donor substrate that is exposed by the material removal and that is peripheral at least in part, preferably completely.

In accordance with a further preferred embodiment of the present invention, the material is removed by means of ablation beams, in particular ablation LASER beams, or ablation fluids, or an indentation with an asymmetrical design is produced by the material removal, or the material removal is performed at least in portions in the peripheral direction of the donor substrate as a reduction of the radial extent of the donor substrate, in the entire region between the detachment region and a surface of the donor substrate distanced homogeneously from the detachment region.

The aforementioned object can be achieved additionally or alternatively by a method for separating solid-body slices from a donor substrate, said method preferably comprising at least the following steps: providing a donor substrate, removing material from the donor substrate, starting from a surface extending in the peripheral direction of the donor substrate, in the direction of the centre of the donor substrate in order to produce an indentation, wherein the material is removed by means of ablation LASER beams and/or the indentation is produced asymmetrically, producing modifications by means of further LASER beams within the donor substrate, wherein the modifications are positioned in such a way that they are adjacent to the indentation, wherein the solid-body slice detaches from the donor substrate by the produced modifications or a stress-inducing layer is produced or arranged on a surface of the donor substrate which is oriented at an incline relative to the peripheral surface and in particular is planar, and mechanical stresses are produced in the donor substrate by a thermal treatment of the stress-inducing layer, wherein the mechanical stresses produce a crack for separating a solid-body layer, which crack propagates along the modifications, starting from the indentation.

The modifications are achieved here preferably using the shortest possible pulses in the smallest possible vertical region by focusing in the material with a high numerical aperture.

During the ablation, the ablation LASER beams are focused on the surface of the material with a lower numerical aperture and often a wavelength absorbed linearly by the material. The linear absorption of the ablation LASER beams at the material surface leads to an evaporation of the material (the ablation), i.e. to a material removal, and not only to a structural change.

This solution is advantageous since an edge region of the donor substrate is processed by means of a material-removing treatment, by means of which the outer edge of the donor substrate is displaced, in the region of the plane in which the crack propagates, towards the centre of the donor substrate. The displacement preferably occurs in the direction of the centre to such an extent that all LASER beams can penetrate the donor substrate over the same planar surface, depending on the penetration depth of the LASER beams and/or the angle of the LASER beams to one another.

The indentation surrounds the donor substrate, in accordance with a further preferred embodiment of the present invention, completely in the peripheral direction. This embodiment is advantageous since the crack can be introduced into the donor substrate in a defined manner over the entire periphery of the donor substrate.

In accordance with a further preferred embodiment of the present invention, the indentation runs towards the centre as far as an indentation end that becomes increasingly narrower, in particular in a wedge-like or V-shaped manner, wherein the indentation end lies in the plane in which the crack propagates. This embodiment is advantageous since a notch is created by the indentation end, which notch predefines the direction of propagation of the crack.

The asymmetric indentation, in accordance with a further preferred embodiment of the present invention, is produced by means of a grinding tool, which is negatively shaped at least in part in order to make the indentation. This embodiment is advantageous since the grinding tool can be produced in accordance with the edge or indentation to be formed.

In accordance with a further preferred embodiment of the present invention, the grinding tool has at least two differently shaped processing portions, wherein a first processing portion is intended for processing of the donor substrate in the region of the underside of a solid-body slice to be separated and a second processing portion is intended for processing of the donor substrate in the region of the upper side of the solid-body slice to be separated from the donor substrate. This embodiment is advantageous since, in addition to shapings for improved crack formation, shapings for improved handling can also be produced by means of the grinding tool at the same time or at a different time on the donor substrate or on the portions of the donor substrate forming one or more solid-body slices.

In accordance with a further preferred embodiment of the present invention, the first processing portion produces a deeper or larger-volume indentation in the donor substrate than the second processing portion, wherein the first processing portion and/or the second processing portion have/has curved or straight grinding faces. The first processing portion preferably has a curved main grinding face and the second processing portion preferably likewise has a curved secondary grinding face, wherein the radius of the main grinding face is greater than the radius of the secondary grinding face, the radius of the main grinding face is preferably at least twice as large as the radius of the secondary grinding face, or the first processing portion has a straight main grinding face and the second processing portion has a straight secondary grinding face, wherein, by means of the main grinding face, more material is removed from the donor substrate than with the secondary grinding face, or the first processing portion has a straight main grinding face and the second processing portion has a curved secondary grinding face, or the first processing portion has a curved main grinding face and the second processing portion has a straight secondary grinding face.

The grinding tool preferably has a multiplicity of processing portions, in particular more than 2, 3, 4, 5, 6, 7, 8, 9 or 10 processing portions, in order to process a corresponding multiplicity of portions of the donor substrate, which can be associated with different solid-body slices, in a machining or material-removing manner.

In accordance with a further preferred embodiment of the present invention, the ablation LASER beams are produced with a wavelength in the range between 300 nm (UV ablation with frequency-tripled Nd:YAG or other solid-body laser) and 10 µm ($CO_2$ glass laser, often used for engraving and cutting processes), with a pulse length of less than 100 microseconds and preferably less than 1 microsecond, and particularly preferably less than $1/10$ of a microsecond, and with a pulse energy of more than 1 µJ and preferably more than 10 µJ. This embodiment is advantageous since the indentation can be produced by means of a LASER device and not by means of a grinding tool, which becomes worn.

The modifications in the donor substrate are produced in a material-dependent manner preferably with the following configurations or LASER parameters: If the donor substrate consists of silicon or the donor substrate comprises silicon, then nanosecond pulses or shorter (<500 ns), a pulse energy in the microjoule range (<100 µJ), and a wavelength >100 nm are preferably used.

In the case of all other materials and material combinations, a pulse <5 picoseconds, pulse energies in the microjoule range (<100 µJ), and wavelengths variable between 300 nm and 2500 nm are preferably used.

It is important here that a large aperture is provided in order to pass deep into the material. The aperture for producing the modifications within the donor substrate is therefore preferably larger than the aperture for ablation of material by means of the ablation LASER beams for producing the indentation. The aperture is preferably multiple times larger, in particular at least 2, 3, 4, 5 or 6 times larger, than the aperture for ablation of material by means of the ablation LASER beams for producing the indentation. The size of the focus for producing a modification, in particular with regard to the diameter of the focus, is preferably smaller than 10 µm, preferably smaller than 5 µm, and particularly preferably smaller than 3 µm.

Alternatively, the present invention can relate to a method for separating solid-body slices from a donor substrate. Here, the method according to the invention preferably comprises at least the following steps: providing a donor substrate, producing modifications within the donor substrate by means of LASER beams, wherein the LASER beams penetrate the donor substrate over a planar surface of the donor substrate, wherein the totality of LASER beams is inclined relative to the surface of the donor substrate in such a way that a first portion of the LASER beams penetrates the donor substrate at a first angle to the surface of the donor substrate and at least one further portion penetrates the donor substrate at a second angle to the surface of the donor substrate, wherein the value of the first angle differs from the value of the second angle, wherein the first portion of the LASER beams and the second portion of the LASER beams are focused in the donor substrate in order to produce the modification, wherein the solid-body slice detaches from the donor substrate by the produced modifications or a stress-inducing layer is produced or arranged on the planar surface of the donor substrate and mechanical stresses are produced in the donor substrate by a thermal treatment of the stress-inducing layer, wherein a crack for separating a solid-body layer is produced by the mechanical stresses and propagates along the modifications. The donor wafer and/or the LASER device emitting the LASER beams are/is preferably rotated about an axis of rotation during the production of the modifications. Additionally or alternatively to the rotation of the donor wafer, the distance of the LASER beams from the centre of the donor wafer is particularly preferably changed.

The totality of LASER beams, in accordance with a further preferred embodiment of the present invention, is oriented in the same orientation relative to the planar surface of the donor substrate for the production of modifications in the region of the centre of the donor substrate and for the production of modifications in the region of an edge of the donor substrate provided in the radial direction.

This solution is advantageous since the total cross-section of the laser beam upon entry into the solid body contacts a planar surface, and since homogeneous damage then occurs in the depth. This homogeneous damage can be produced as far as the outer edge of the donor substrate extending in particular orthogonally to the planar surface. The modifications in the edge region of the donor substrate and in the region of the centre of the donor substrate can thus be produced by means of one processing step.

In accordance with a further preferred embodiment of the present invention, the first portion of the LASER beams penetrates the donor substrate at a first angle to the surface of the donor substrate and the further portion of the LASER beams penetrates at a second angle for production of modifications in the region of the centre of the donor substrate and for production of modifications in the region of an edge of the donor substrate provided in the radial direction, wherein the value of the first angle always differs from the value of the second angle. The first angle and the second angle are preferably constant or unchanged or are not actively changed during the production of the modifications. This embodiment is advantageous since In accordance with a further preferred embodiment of the present invention, the LASER device comprises a femtosecond LASER (fs LASER) or a picosecond LASER (ps LASER), and the energy of the LASER beams of the LASER (fs LASER or ps LASER) is preferably selected in such a way that the propagation of damage of each modification in the top layer and/or the sacrificial layer is less than 3 times the Rayleigh length, preferably less than the Rayleigh length, and particularly preferably less than a third of the Rayleigh length and/or the wavelength of the LASER beams of the fs LASER is selected in such a way that the absorption of the top layer and/or of the sacrificial layer is less than 10 $cm^{-1}$ and preferably less than 1 $cm^{-1}$ and particularly preferably less than 0.1 $cm^{-1}$ and/or the individual modifications are produced in each case as a result of a multi-photon excitation brought about by the fs LASER.

In accordance with a further preferred embodiment of the present invention the LASER beams for producing the modifications penetrate the donor wafer over a surface that is part of the solid-body slice to be separated. This embodiment is advantageous since the donor substrate is heated to a lesser extent, whereby the donor substrate is exposed only to low thermal stresses.

In accordance with a further preferred embodiment of the present invention, the ablation radiation comprises accelerated ions and/or plasma and/or LASER beams and/or is formed by electron beam heating or ultrasound waves and/or is part of a lithographic method (electron beam, UV, ions, plasma) with at least one etching step following a previously executed photoresist coating and/or the ablation fluid is a liquid jet, in particular a water jet of a water jet cutting process.

The stress-inducing layer, in accordance with a further preferred embodiment of the present invention, comprises a polymer, in particular polydimethylsiloxane (PDMS), or consists thereof, wherein the thermal treatment is preferably performed in such a way that the polymer experiences a glass transition, wherein the stress-inducing layer is temperature-controlled, in particular by means of liquid nitrogen, to a temperature below room temperature (i.e. to a temperature below 20° C.) or below 0° C. or below −50° C. or below −100° C. or below −110° C., in particular to a temperature below the glass transition temperature of the stress-inducing layer.

This embodiment is advantageous since it has been found that, due to the thermal treatment of the stress-inducing layer, in particular by utilisation of the property changes of the material of the stress-inducing layer occurring with the glass transition, the forces necessary to initiate and form a crack can be produced in a donor substrate.

The donor substrate preferably comprises a material or a material combination from one of the main groups 3, 4 and 5 of the Periodic Table of Elements, such as Si, SiC, SiGe, Ge, GaAs, InP, GaN, Al2O3 (sapphire), AlN, or consists of one or more of these materials. The donor substrate particularly preferably comprises a combination of elements occurring in the third and fifth group of the Periodic Table of Elements. Conceivable materials or material combinations are for example gallium arsenide, silicon, silicon carbide, etc. Furthermore, the donor substrate can comprise a ceramic (for example Al2O3—aluminium oxide) or can consist of a ceramic, preferred ceramics being for example perovskite ceramics (such as Pb-, O-, Ti/Zr-containing ceramics) in general, and lead magnesium niobates, barium titanate, lithium titanate, yttrium aluminium garnet, in particular yttrium aluminium garnet crystals for solid-body laser applications, SAW (surface acoustic wave) ceramics, such as lithium niobate, gallium orthophosphate, quartz, calcium titanate, etc., in particular. The donor substrate thus preferably comprises a semiconductor material or a ceramic material, or the donor substrate particularly preferably consists of at least one semiconductor material or a ceramic material. It is also conceivable that the donor substrate comprises a transparent material or partially consists of or is made of a transparent material, such as sapphire. Further materials which can be considered here as solid-body material alone or in combination with another material are for example "wide band gap" materials, InAlSb, high-temperature superconductors, in particular rare earth cuprates (for example YBa2Cu3O7).

The subject matter of patent application DE 2013 205 720.2 with the title: "Method for rounding edges of semiconductor parts produced from a semiconductor starting material, and semiconductor products produced by this method" is hereby incorporated by reference in its full extent in the subject matter of the present description.

The use of the word "substantially" in all cases in which this word is used within the scope of the present invention preferably defines a deviation in the range of 1% to 30%, in particular 1% to 20%, in particular 1% to 10%, in particular 1% to 5%, in particular 1% to 2%, from the definition that would be given without the use of this word.

Further advantages, objectives and properties of the present invention will be explained on the basis of drawings accompanying the following description, in which the solutions according to the invention are illustrated by way of example. Components or elements or method steps of the solutions according to the invention which in the figures coincide at least substantially in terms of their function can be denoted here by the same reference signs, wherein these components or elements do not have to be provided with reference signs or explained in all figures.

Figure 1:
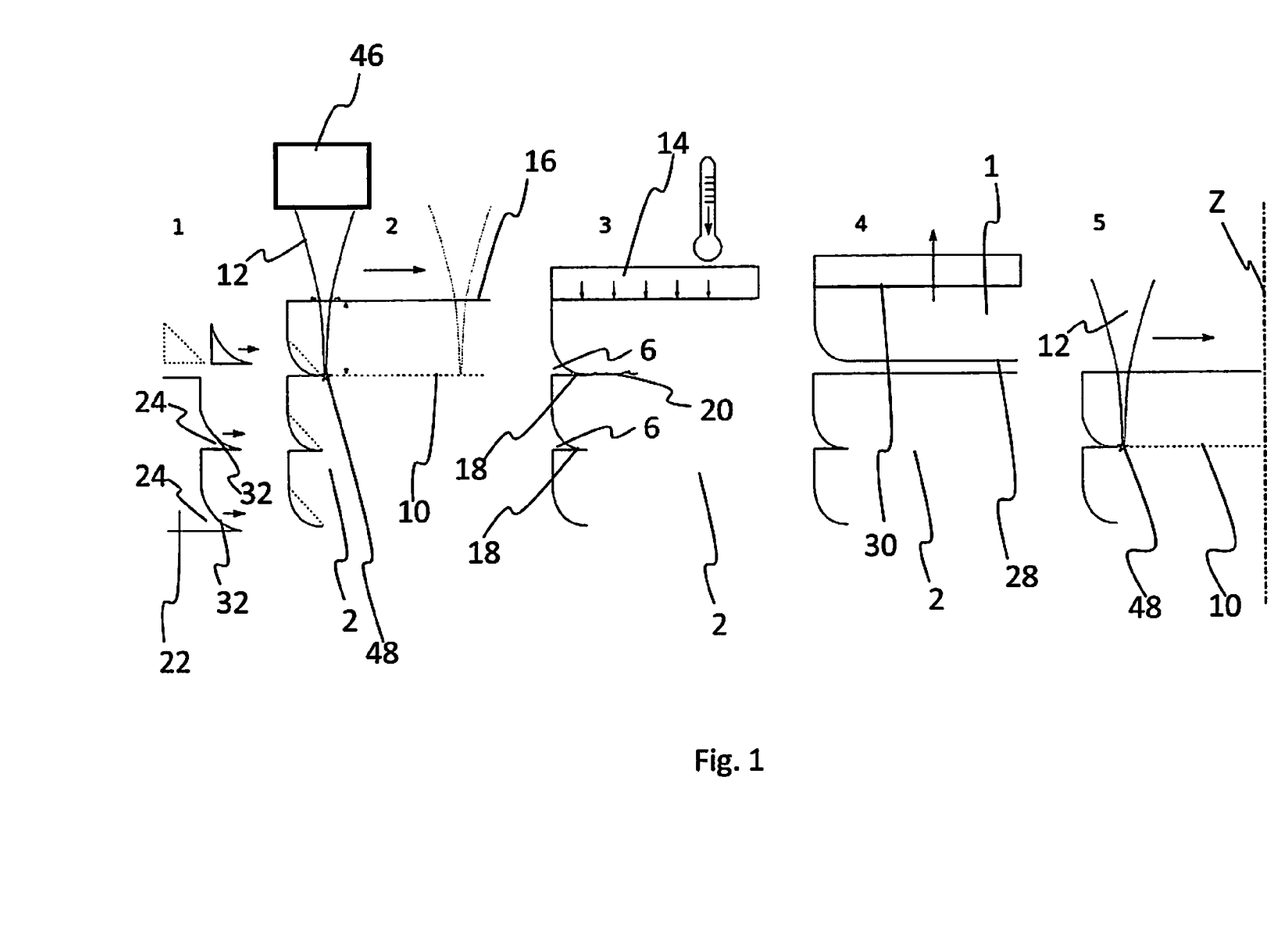
FIG. 1 shows a first example of an edge treatment within the scope of the solid-body slice production according to the invention.

FIG. 1 shows 5 illustrations, by means of which examples of the solid-body slice production or wafer production according to the invention are shown. Illustration 1 shows a grinding tool 22, which has two processing portions 24 distanced from one another, which each form a main grinding face 32. The main grinding faces 32 are formed here so that they produce indentations 6 in a donor substrate 2. The grinding tool 22 is preferably formed as a rotary grinding tool or as a belt grinding tool.

Illustration 2 of FIG. 1 shows a donor substrate 2, in which indentations 6 have been produced by means of the grinding tool 22. Here, the indentations 6 are distanced preferably uniformly from one another in the longitudinal direction of the donor wafer 2, wherein it is also conceivable for the distances to be of different sizes. In accordance with the second illustration in FIG. 2, modifications 10 are also produced in the donor substrate 2 by means of a LASER device 46. The LASER device 46 for this purpose emits LASER beams 12, which penetrate the donor substrate 2 over a preferably planar surface 16 of the donor substrate 2, and a modification 10 of the lattice structure of the solid body or of the donor substrate 2 is produced or brought about at a focus point 48, in particular by a multi-photon excitation. Here, the modification 10 is preferably a material conversion, in particular a conversion of the material into another phase, or a material degradation.

The third illustration shows that a stress-inducing layer 14 has been produced or arranged on the surface 16 over which the LASER beams 12 were introduced into the donor substrate 2 for production of the modifications 10. The stress-inducing layer 14 is thermally treated or temperature-controlled, in particular cooled, in order to produce mechanical stresses in the donor substrate 2. By means of the thermal treatment of the stress-inducing layer 14, the stress-inducing layer 14 contracts, whereby the mechanical stresses are produced in the donor substrate 2. The previously produced indentations 6 form notches, through which the mechanical stresses can be conducted in such a way that the crack 20 resulting from the stresses propagates in a targeted manner in the region of crack formation predefined by the modifications 10. The indentation ends 18 therefore are preferably adjacent to the respective regions of crack formation predefined by the modifications 10. It is preferably always the case that only precisely the solid-body layer 1 of which the indentation 6 is distanced least far from the stress-inducing layer 14 is split off.

Illustration 4 shows a state following crack propagation. The solid-body slice 1 has been split off from the donor substrate 2, and the stress-inducing layer 14 initially still remains on the surface 16 of the solid-body slice 1.

Reference sign 28 denotes the side of the solid-body slice 1 which is denoted here as the underside of the solid-body slice 1, and reference sign 30 denotes the side of the solid-body slice 1 which is denoted here as the upper side of the solid-body slice 1.

Illustration 5 shows a method in which the solid-body layer 1 detaches from the donor substrate 2 without a stress-inducing layer 14. Here, following production of the indentation 6, so many modifications 10 are preferably produced by means of LASER beams 12, that the solid-body layer 1 detaches from the donor substrate 2. The dashed line Z here preferably characterises a centre or an axis of rotation of the donor substrate 2. The donor substrate 2 is preferably rotatable about the axis of rotation Z.

Figure 2:
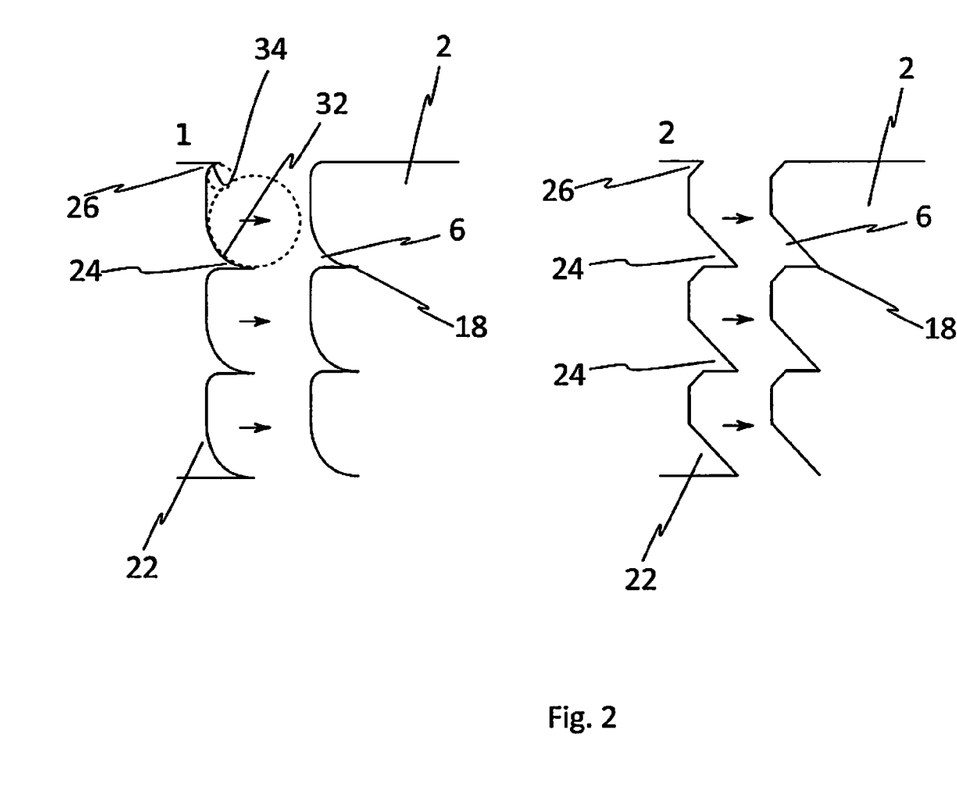
FIG. 2 shows examples of contours of grinding tools as can be used in accordance with the method shown in FIG. 1.

FIG. 2 shows two illustrations, wherein each illustration shows a grinding tool 22 with a specific contour. If reference is made to a planar, straight or curved portion with regard to the grinding tool, this is always understood to mean a portion of the shown contour. Of course, the grinding tool 22 can be formed for example as a rotary grinding tool, whereby the portions adjacent to the contour in the peripheral direction would preferably extend in a curved manner in the peripheral direction. The grinding tool 22 shown in the first illustration of FIG. 2 has a first processing portion 24, which has a curved main grinding face 32, and has a second processing portion 26, which has a curved secondary grinding face 34, wherein the radius of the main grinding face 32 is greater than the radius of the secondary grinding face 34, preferably the radius of the main grinding face 32 is at least twice, three times, four times or five times as great as the radius of the secondary grinding face 34.

In accordance with the second illustration of FIG. 2, the first processing portion 24 of the grinding tool 22 has a straight main grinding face 32 and the second processing portion 26 has a straight secondary grinding face 34, wherein more material is removed from the donor substrate 2 by means of the main grinding face 32 than by means of the secondary grinding face 34.

The grinding tools 22 shown in FIG. 2 and the indentations produced by the shown grinding tools 22 can likewise be used in respect of the illustrations shown in FIG. 1.

Figure 3:
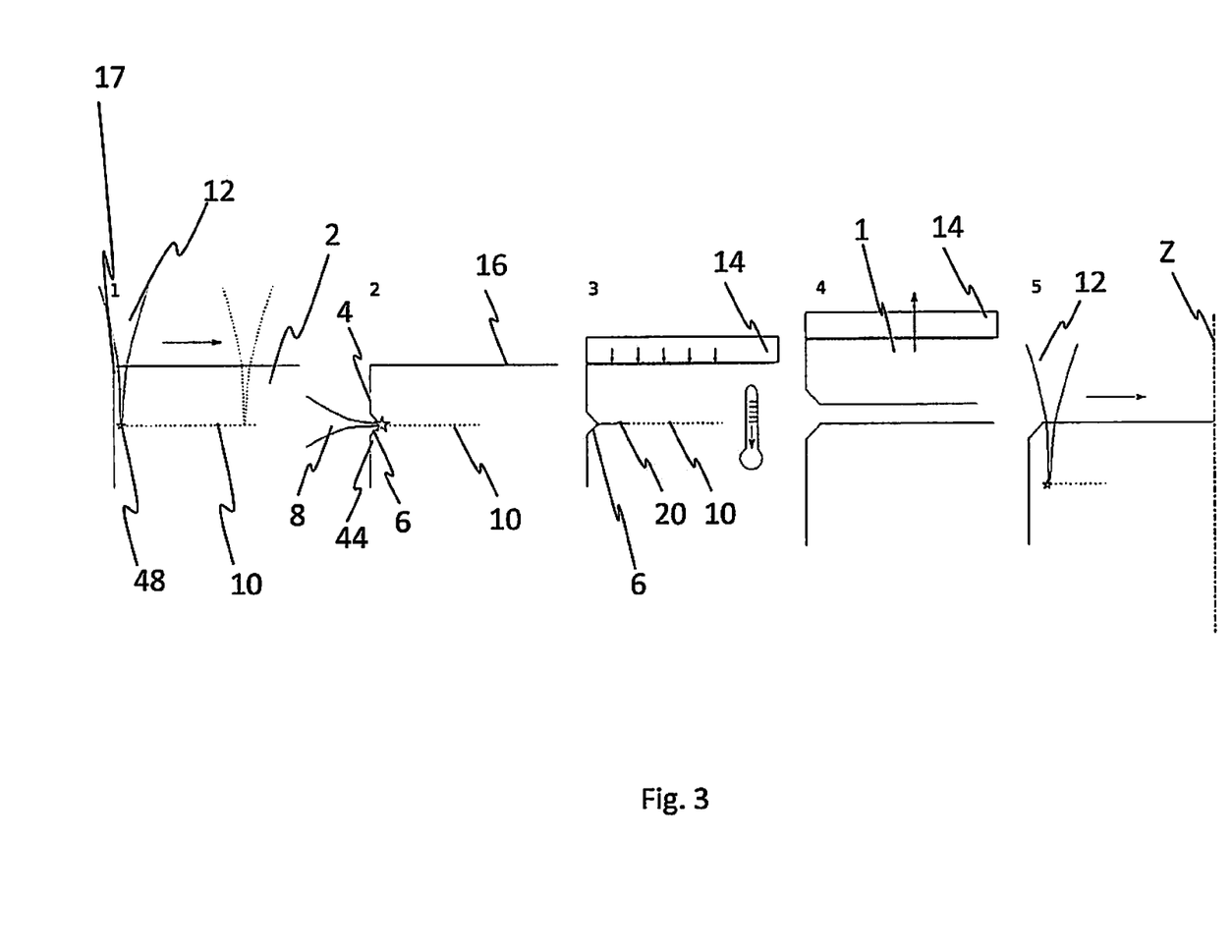
FIG. 3 shows a second example of an edge treatment within the scope of the solid-body slice production according to the invention.

FIG. 3 shows a further variant of the method according to the invention. By means of a comparison of the first and fifth illustration, it can be seen that the modifications 10 produced by means of the LASER beams 12, in the case of a planar surface 16, can be produced closer to the edge 44 than if the tip of the edge 17 of the surface 16 is removed, as shown in the fifth illustration. The LASER beams 12 here penetrate the donor substrate 2, similarly to the modification production explained with reference to FIG. 1.

The second illustration of FIG. 3 shows the production of an indentation 6 starting from a peripheral surface 4 in the direction of the centre Z of the donor substrate 2, wherein the indentation is produced by means of ablation LASER beams 8 of an ablation LASER (not shown). The ablation LASER beams 8 here preferably evaporate the material of the donor substrate 2 in order to produce the indentation 6.

Illustration 3 of FIG. 3 corresponds substantially to illustration 3 of FIG. 2, wherein merely the form of the indentation here is not asymmetrical, but instead is symmetrical. In accordance with this illustration as well, a stress-inducing layer 14 is thus produced or arranged on the donor substrate 2 and is thermally treated, in particular by means of liquid nitrogen, in order to produce mechanical stresses for initiating a crack 20.

Illustration 4 of FIG. 3 shows the solid-body slice 1 split off from the donor substrate 2, with the stress-inducing layer still arranged on said solid-body slice.

It can also be seen from illustration 5 of FIG. 3 that in the case of a donor substrate 2 of which the tip of the edge 17 is processed, the indentation 6 to be produced by means of ablation LASER beams 8 must reach further in the direction of the centre of the donor substrate 2 than if the tip of the edge 17 is not processed. Here, however, it is also conceivable that the indentation is not produced by means of ablation LASER beams 8, but instead by means of a grinding tool 22 (as is known for example from FIGS. 1 and 2).

Figures 4A, 4B, 4C:
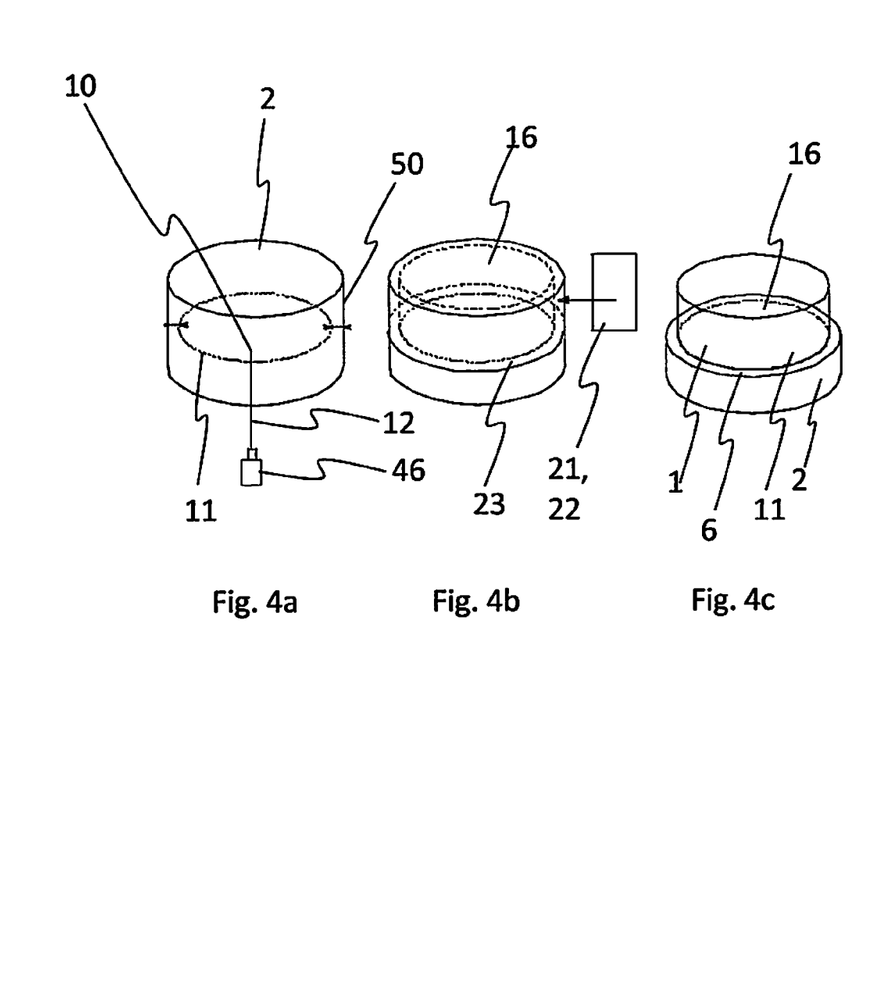
FIGS. 4a-4d show a third example of an edge treatment within the scope of the solid-body slice production according to the invention.

FIG. 4a shows an additional or alternative solution according to the invention for the separation of solid-body layers 1 from a donor substrate 2. In accordance with FIG. 4a, a detachment region 11 is produced within the donor substrate 2. The modifications 10 are preferably distanced here from a peripheral delimiting face 50 of the donor substrate 2. The modifications 10 are preferably produced similarly to illustration 2 of FIG. 1. Here, it is conceivable that the LASER beams 12 are introduced into the donor substrate 2 from below or from above, i.e. over the surface 16.

FIG. 4b schematically shows the processing of the donor substrate 2 by means of an ablation tool 22, in particular a tool for machining the donor substrate 2, such as a grinding tool 22. By means of the processing, material is removed, at least in portions in the peripheral direction of the donor substrate 2, in the entire region between the detachment region and a surface of the donor substrate 2 distanced preferably homogeneously, in particular in parallel, from the detachment region, for reduction of the radial extent of the donor substrate 2. The material is preferably removed in an annular manner, in particular with a constant or substantially constant radial extent.

FIG. 4c shows an example of a state after the removal of the material. Here, it is conceivable for example that the material is removed in the axial direction of the donor substrate 2 up to the detachment plane, or therebeneath or thereabove.

Figure 4D:
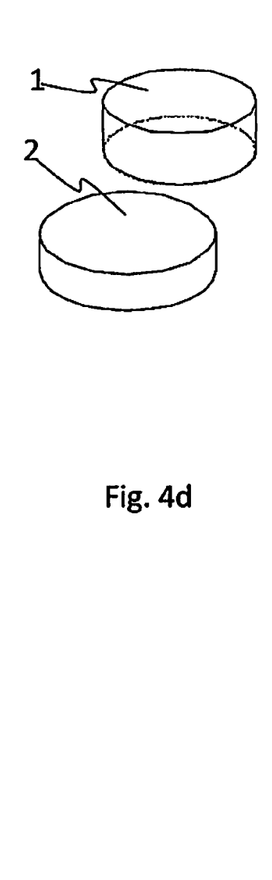

FIG. 4d shows a state following the separation or detachment of the solid-body layer 1 from the donor substrate 2.

Figure 5A:
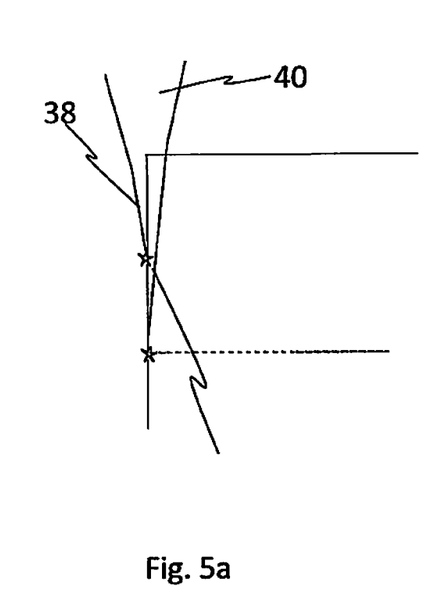
FIGS. 5a-5b show an illustration of a problem occurring when producing modifications by means of LASER beams in the edge region of a donor substrate.
Figure 5B:
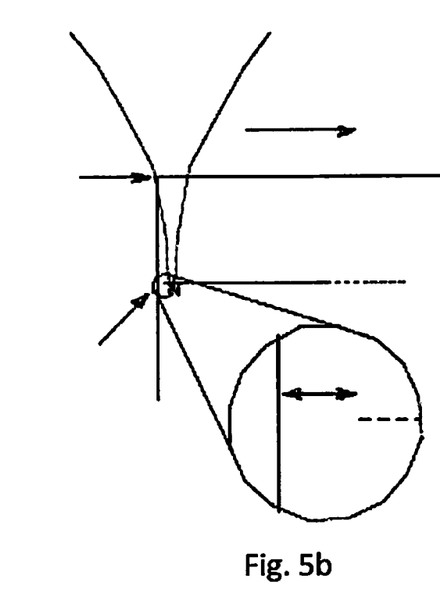

FIGS. 5a and 5b show a problem in the edge region of the donor substrate 2 occurring with the production of modifications by means of LASER beams 12. By means of the different refractive indices in the air and in the donor substrate, the LASER beam portions 38, 40 of a LASER beam 12 do not coincide exactly with one another, thus resulting in undesirable effects, such as the production of defects at undesirable locations, an undesirable local heating, or a prevention of the production of a modification.

FIG. 5b shows that a problem-free production of modifications 10 can be provided only if the modification 10 to be produced is distanced from the peripheral surface of the donor substrate 2 to such an extent that both LASER beam portions 38, 40 are each refracted through material with the same refractive index and preferably over the same distance. However, this means that the production of the modification, as it occurs in the region distanced from the edge region, cannot be readily extended to the edge region.

The present invention thus relates to a method for separating solid-body slices 1 from a donor substrate 2. Here, the method according to the invention comprises the following steps:

providing a donor substrate 2, removing material from the donor substrate 2, starting from a surface 4 extending in the peripheral direction of the donor substrate 2, in the direction of the centre Z of the donor substrate 2 in order to produce an indentation 6, wherein the material is removed by means of ablation LASER beams 8 and/or the indentation 6 is produced asymmetrically, producing modifications 10 within the donor substrate 2 by means of further LASER beams 112, wherein the modifications 10 are positioned in such a way that they are adjacent to the indentation 6, wherein the solid-body slice 1 detaches from the donor substrate 2 by means of the produced modifications 10, or a stress-inducing layer 14 is produced or arranged on a surface 16 of the donor substrate 2, which surface is oriented at an incline to the peripheral surface and in particular is planar, and mechanical stresses are produced in the donor substrate 2 by a thermal treatment of the stress-inducing layer 14, wherein the mechanical stresses produce a crack 20 for separating a solid-body layer 1, which crack propagates along the modifications 10, starting from the indentation 6.

The present invention thus relates to a method for separating solid-body slices 1 from a donor substrate 2. Here, the method according to the invention comprises the following steps:

producing modifications 10 within the donor substrate 2 by means of LASER beams 12, wherein a detachment region is predefined by the modifications 10, along which detachment region the solid-body layer 1 is separated from the donor substrate 2, removing material from the donor substrate 2, starting from a surface 4 extending in the peripheral direction of the donor substrate 2 in the direction of the centre Z of the donor substrate 2, in particular in order to produce a peripheral indentation 6, wherein the detachment region is exposed by the material removal, separating the solid-body layer from the donor substrate, wherein the donor substrate is weakened in the detachment region by the modifications in such a way that the solid-body layer 1 detaches from the donor substrate 2 as a result of the material removal or such a number of modifications are produced after the material removal that the donor substrate is weakened in the detachment region in such a way that the solid-body layer 1 detaches from the donor substrate 2 or a stress-inducing layer 14 is produced or arranged on a surface 16 of the donor substrate 2, which surface is oriented at an incline to the peripheral surface and in particular is planar, and mechanical stresses are produced in the donor substrate 2 by a thermal treatment of the stress-inducing layer 14, wherein the mechanical stresses produce a crack 20 for separating a solid-body layer 1, which crack propagates along the modifications 10, starting from the surface of the donor substrate exposed by the material removal.

Figure 6:
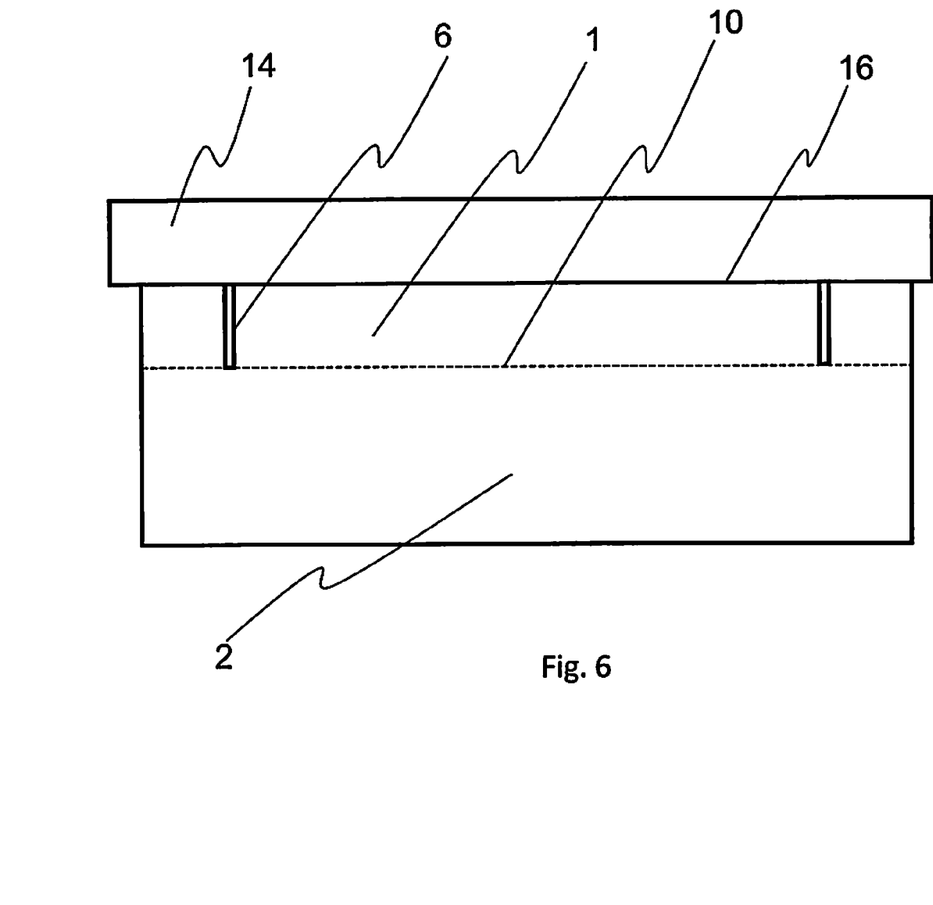
FIG. 6 shows a schematic illustration of a solid body that has indentations covered or superimposed or closed by a stress-inducing layer.

FIG. 6 schematically shows an arrangement in accordance with which the stress-inducing layer 14 preferably superimposes or covers or closes at least one indentation 6, in particular a recess or hollow cavity, which extends preferably starting from a planar or substantially planar surface 16 in the direction of a further surface of the solid body 2, which further surface is preferably parallel to the planar surface 16.

The stress-inducing layer 14 is preferably produced as a polymer layer or is produced as a layer that consists predominantly in terms of proportions by mass and/or proportions by volume of at least one polymer material. The surface 16 on which the stress-inducing layer 14 is arranged preferably has treated portions. Here, 'treated portions' is preferably understood to mean portions in which material has been removed. One or more indentations, in particular recesses 6 and/or hollow cavities 6, thus preferably extend preferably orthogonally to the surface and/or the crack-forming layer, starting from the surface 16 on which the stress-inducing layer 14 is arranged and which preferably extends substantially or completely parallel to a crack-forming layer formed from modifications 10. Here, it is alternatively conceivable that only one indentation 6, in particular a hollow cavity and/or a recess, has been produced and/or is formed by means of material removal. The material removal is preferably performed, in particular by means of laser ablation, before the production or attachment of the stress-inducing layer 14 on the surface 16. The stress-inducing layer 14, in the state coupled or connected to the solid body 2, covers the indentation(s) 6, in particular the hollow cavity or the hollow cavities or the recess or the recesses.

There is preferably no further coating, in particular no further material application, between the production of the indentation 6, in particular the recess and/or the hollow cavity, and the attachment of the stress-inducing layer. This is advantageous since otherwise material could accumulate in the recess/hollow cavity.

The stress-inducing layer is preferably attached by means of a plasma lamination process. This is advantageous since a connection between the solid body 1, in particular the main surface 16 of the later solid-body layer 1, and the stress-inducing layer 14 can thus be produced over the indentation 6, in particular recess/hollow cavity. The connection is preferably a lamination or adhesive bonding. It is preferably implemented with use of cold plasma.

Additionally or alternatively, a "spontaneous split" with previously produced laser plane or crack-forming plane and depth modification can be brought about in accordance with the invention by a material removal step, in particular laser ablation. This is preferably implemented without stress-inducing layer 14.

The stress-inducing layer 14 can also be referred to as a stressor layer, in particular as a self-supporting stressor layer.

In accordance with the invention it has also been found that a self-supporting stressor layer is of significant technical advantage compared to a stressor layer applied by vapour deposition or applied by some other form of deposition, since stressor layers of this kind can be produced on the one hand in larger volume in simpler methods in specialised facilities with a higher throughput and on the other hand can be used in lamination processes, which likewise allow quicker process speeds. In addition, self-supporting stressor layers can also be removed again from the substrate following lamination processes, even with little effort, which for example also allows re-use, i.e. of the stressor layer or of the stress-inducing layer, which is not possible with deposited layers.

It is particularly advantageous that lamination processes can also be performed without adhesive bonding methods or the like purely by a surface activation, surface treatment, or surface modification of the substrate. A coupling or connection of the stress-inducing layer to the solid body, in particular to the surface 16 of the later solid-body layer 1, is thus achieved particularly preferably by a surface activation and/or surface treatment and/or surface modification of the solid body or the surface 16 of the later solid-body layer 1.

For example, the surface can preferably be activated by contact with, in particular in a chamber, produced ozone and/or by ultraviolet light of a certain wavelength and/or by plasma methods with different formed species on the surfaces of the substrate and/or the stressor layer and/or in the process gas, in particular radical aldehyde and alcohol species. Here, hot plasma methods are preferred in particular, in which high temperatures are used in order to produce free charge carriers and radicals in the plasma, which, for the subsequent reactions at the surfaces of substrate and stressor layer, allows other reaction paths and chemical surface reactions compared to lower temperatures. The surface modification mechanism can thus differ in a temperature-dependent manner, also between various substrates, wherein for example in the case of SiC, compared to Si, the carbon atoms involved can form different surface species in the plasma treatment which can likewise have an adhesion-promoting effect in the lamination process.

Alternatively, the use of a cold plasma method is possible, in which a plasma is not produced by thermionic emission or via hot tungsten filaments or similar methods, but instead via piezoelectric transformers at atmospheric pressure and preferably without elevated temperatures. These lower temperatures likewise reduce and/or change the available reaction paths for surface activations and surface modifications for adhesion promotion in lamination processes, both at the substrate or the solid body and at the stressor layer. The resultant surface species are thus dependent on a multiplicity of parameters and the surface activation method in particular.

The surface treatment or modification for example comprises the exposure, at least in portions, of the surface to be treated by a corona treatment and/or a flame treatment and/or a treatment by means of electrical barrier discharge and/or fluorination and/or by ozonisation and/or by excimer irradiation and/or by a treatment with a plasma, wherein individual or a plurality of physical parameters, such as the type of plasma, the path distance during the plasma treatment, the nozzle type, the nozzle distance and/or the duration of the plasma treatment, are preferably varied or can be varied.

A plasma pre-treatment or plasma treatment is preferably used both for cleaning and then for homogenisation of the surface species (for example hydrophobising, amongst others).

A spatially resolved variation of the surface activation can be produced or adjusted by means of a selective individual plasma treatment and then allows a lamination of the stressor layer, likewise with different properties in different areas, if desired.

The process of the plasma surface activation or of the plasma surface treatment allows a greater influencing in order to apply the desired differentiated adhesion or force transfer after the lamination of the stressor layer on the substrate also over large areas in a defined symmetrical or asymmetrical form. Here, by means of process variation, an amended adhesion or cohesion can be set, in particular locally. Depending on the starting properties of the different solid-body materials, in particular semiconductor materials, layers can be applied and/or the desired auxiliary layer(s), in particular sacrificial/damage layers or substrate and/or stressor layer surfaces, can be selectively modified (hydrophobic, hydrophilic, wetting, etc.) by further gradual process gases (oxygen, amongst others). This leads to a spatially resolved, adapted gradual adhesion or spatially resolved adapted or adjusted force transfer connection, also in lamination processes, which is only homogeneous and not spatially resolved compared to that by adhesive bonding and deposition solutions for the stressor layer.

As already described, different physical parameters can be used during the plasma treatment (for example plasma type, path distance during the plasma treatment, nozzle type, nozzle distance, duration of the plasma treatment). In addition to these influencing parameters, a greater bandwidth of the necessary surface properties can be provided by selective admixing of gradual process gases, such as nitrogen, oxygen, hydrogen, $SiH_4$, $Si(EtO)_4$ or $Me_3SiOSiMe_3$ (amongst others). These result preferably from new chemical surface species, which deposit themselves on the semiconductor surface and/or the adjoining sacrificial layers and/or the stressor layer and thus enable a different surface functionality and lamination process properties. This leads to the desired target profiles, for example different spatially resolved adhesion and cohesion properties, of the semiconductor surfaces and/or the adjoining stressor and/or other layers.

A corona treatment is an electrochemical method for surface treatment or modification of plastics. Here, the surface is exposed to an electric high-voltage discharge. A corona treatment is used for example to promote adhesion in plastics and films, amongst others (PE, PP).

In the case of a flame treatment a surface-near oxidation of the respective compounds takes place in particular. In principle, oxidation processes are performed, by means of which different polar functional groups are formed (for example oxides, alcohols, aldehydes, carboxylic acids, esters, ethers, peroxides) depending on the material and test conditions.

A treatment by dielectric barrier discharge (DBE, AC voltage gas discharge, also DBD treatment) is similar to a low-temperature plasma or glow discharge (for example GDMS). In the case of DBE treatment the surface is acted on by unipolar or bipolar pulses with pulse durations of a few microseconds down to tens of nanoseconds and amplitudes in the single-digit kilovolt range. A dielectric barrier discharge is advantageous since no metal electrodes are anticipated in the discharge chamber, and therefore no metal contaminations or electrode wear is anticipated.

Further advantages of the dielectric barrier discharge, depending on application, for example can be that it has a high efficiency, since no charge carriers have to exit or enter at the electrodes (omission of the cathode drop, no glow emission necessary), or that the dielectric surfaces can be modified and chemically activated at low temperatures. The surface modification is performed here preferably by an interaction and reaction of the surface species by ion bombardment and the effect of ultraviolet radiation on the surface species (for example 80 nm-350 nm, incoherent UV and VUV light, by high-frequency power generators). The dielectric barrier discharge is used for example for in situ production of ozone in drinking water/wastewater treatment, wherein the water is ozonised by the ozone. Similarly, in the case of a surface treatment or modification according to the invention by means of ozonisation, the surface to be treated is acted on by ozone.

A surface treatment or modification by means of halogenation, in particular fluorination, causes an element or a compound to be converted into a halide. By means of the fluorination, fluorine is thus introduced into preferably organic compounds with the aid of fluorinating agents.

A surface treatment or modification by means of UV treatment is performed preferably by excimer irradiation or by ultraviolet light-emitting diode sources, for example based on aluminium nitride. Excimer irradiation is performed by the use of at least one excimer LASER. Excimer LASERs are gas LASERs which can generate electromagnetic radiation in the ultraviolet wavelength range. A gas discharge occurring in this case is thus caused by an electromagnetic high-frequency field. There is thus also no need for any electrodes for the gas discharge. The produced UV radiation lies preferably in a wavelength range between 120 nm and 380 nm.

REFERENCE LIST 1 solid-body slice
2 donor substrate
4 surface extending in the peripheral direction
6 indentation
8 ablation LASER beams 10 modifications
11 detachment region
12 further LASER beams
14 stress-inducing layer
16 planar surface
17 edge
18 indentation end
20 crack
21 ablation tool
22 grinding tool
23 ring
24 first processing portion
34 secondary grinding face
36 first portion of LASER beams
38 first angle
40 further portion
42 second angle
44 edge
46 LASER device
48 LASER focus
50 peripheral delimiting face

The invention claimed is:

1. A method for separating a solid-body layer from a substrate, the method comprising:
producing modifications within the substrate using a laser device, the modifications defining a detachment region within the substrate that is weakened by the modifications, the modifications being produced within the substrate at a distance from a delimiting edge of the substrate;
arranging a stress-inducing layer on a surface of the substrate;
thermally treating the stress-inducing layer so as to produce mechanical stress in the substrate, the mechanical stress creating a crack which propagates in a targeted manner in a region of crack formation predefined by the modifications;
removing material from the delimiting edge of the substrate up to the detachment region, or beneath or above the detachment region; and
separating the solid-body layer from the substrate along the crack.

2. The method of claim 1, wherein thermally treating the stress-inducing layer comprises cooling the stress-inducing layer.

3. The method of claim 1, further comprising:
forming an indentation in a delimiting edge of the substrate,
wherein an end of the indentation is adjacent to the region of crack formation predefined by the modifications.

4. The method of claim 3, wherein forming the indentation comprises:
applying a grinding tool to the delimiting edge of the substrate, the grinding tool comprising a first processing portion having a curved main grinding face and a second processing portion having a curved secondary grinding face,
wherein the radius of the main grinding face is greater than the radius of the secondary grinding face.

5. The method of claim 3, wherein forming the indentation comprises:
applying a grinding tool to the delimiting edge of the substrate, the grinding tool comprising a first processing portion having a straight main grinding face and a second processing portion having a straight secondary grinding face,
wherein more material is removed from the delimiting edge of the substrate by the main grinding face than by the secondary grinding face.

6. The method of claim 3, wherein forming the indentation comprises:
directing one or more ablation laser beams at the delimiting edge of the substrate to evaporate material of the substrate and produce the indentation.

7. The method of claim 6, wherein the surface of the substrate meets the delimiting edge of the substrate without a change in planarity.

8. The method of claim 6, wherein the indentation is symmetrical about the end of the indentation.

9. The method of claim 3, wherein the stress-inducing layer covers or closes the indentation.

10. The method of claim 3, wherein the indentation extends from the surface of the substrate on which the stress-inducing layer is arranged to the modifications.

11. The method of claim 3, wherein the stress-inducing layer is a polymer layer, and wherein the polymer layer is the only material accumulated in the indentation.

12. A method for separating a solid-body layer from a substrate, the method comprising:
forming an indentation in a delimiting edge of the substrate;
producing modifications within the substrate using a laser device, the modifications defining a detachment region within the substrate that is weakened by the modifications and aligned with the indentation; and
detaching the solid-body layer from the substrate along the detachment region,
wherein the modifications are produced at a distance from the delimiting edge of the substrate to an extent such that laser beam portions emitted from the laser device are each refracted through material with a same refractive index.

13. The method of claim 12, wherein the laser beam portions emitted from the laser device are each refracted through the material over a same distance.

14. The method of claim 12,
wherein an end of the indentation is adjacent to the region of crack formation predefined by the modifications.

15. The method of claim 14, wherein forming the indentation comprises:
applying a grinding tool to the delimiting edge of the substrate, the grinding tool comprising a first processing portion having a curved main grinding face and a second processing portion having a curved secondary grinding face,
wherein the radius of the main grinding face is greater than the radius of the secondary grinding face.

16. The method of claim 14, wherein forming the indentation comprises:
applying a grinding tool to the delimiting edge of the substrate, the grinding tool comprising a first processing portion having a straight main grinding face and a second processing portion having a straight secondary grinding face,
wherein more material is removed from the delimiting edge of the substrate by the main grinding face than by the secondary grinding face.

17. The method of claim 14, wherein forming the indentation comprises:
directing one or more ablation laser beams at the delimiting edge of the substrate to evaporate material of the substrate and produce the indentation.

* * * * *